(12) United States Patent
Saeki

(10) Patent No.: US 7,734,001 B2
(45) Date of Patent: Jun. 8, 2010

(54) FRACTIONAL FREQUENCY DIVIDER CIRCUIT AND DATA TRANSMISSION APPARATUS USING THE SAME

(75) Inventor: Takanori Saeki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 1122 days.

(21) Appl. No.: 11/052,819

(22) Filed: Feb. 9, 2005

(65) Prior Publication Data

US 2005/0174153 A1 Aug. 11, 2005

(30) Foreign Application Priority Data

Feb. 9, 2004 (JP) ............... 2004-032078

(51) Int. Cl.
*H03D 3/24* (2006.01)
(52) U.S. Cl. ...................... 375/376; 327/117
(58) Field of Classification Search ........... 327/115, 327/117; 375/376; 377/116
See application file for complete search history.

(56) References Cited

U.S. PATENT DOCUMENTS

| | | | | |
|---|---|---|---|---|
| 4,656,649 | A * | 4/1987 | Takahashi | 377/48 |
| 4,999,528 | A * | 3/1991 | Keech | 327/198 |
| 5,172,400 | A * | 12/1992 | Maemura | 377/116 |
| 5,727,019 | A * | 3/1998 | Tatsumi | 375/222 |
| 5,729,179 | A * | 3/1998 | Sumi | 331/12 |
| 6,396,355 | B1 * | 5/2002 | Rezin | 331/18 |
| 6,710,951 | B1 | 3/2004 | Cloke | |
| 2002/0163389 | A1 | 11/2002 | Jun | |
| 2004/0012423 | A1 | 1/2004 | Maeda | |
| 2004/0190669 | A1 * | 9/2004 | Gutierrez et al. | 375/376 |
| 2005/0084051 | A1 * | 4/2005 | Nauta et al. | 375/376 |

(Continued)

FOREIGN PATENT DOCUMENTS

CN 1257349 A 6/2000

(Continued)

OTHER PUBLICATIONS

W. J. Dally/J. W. Poulton, translated by Tadahiro Kuroda, Maruzen Co., Ltd., "Dejitaru Shisutemu Kogaku Oyo-hen" [Digital Systems Engineering] published Mar. 30, 2003; pp. 720-721.

(Continued)

*Primary Examiner*—David C Payne
*Assistant Examiner*—Leon-Viet Q Nguyen
(74) *Attorney, Agent, or Firm*—Sughrue Mion, PLLC

(57) ABSTRACT

A fractional frequency divider circuit with a small circuit scale that outputs a clock with a duty ratio of 50%, and a data transmission apparatus comprising same. The fractional frequency divider circuit is constituted by multiple master-slave flip-flops, and comprises an integer frequency divider circuit that frequency-divides a clock signal with a frequency-division ratio of 1/N(N is an integer), and a logic circuit into which multiple signals outputted from master stages and slave stages of the master-slave flip-flops are inputted and that outputs a signal with a duty ratio of 50% obtained by frequency-dividing the clock signal with a frequency-division ratio of 2/N. The data transmission apparatus is constituted such that it is possible to switch over between a frequency-multiplied clock outputted by a PLL and a clock obtained by frequency-dividing the frequency-multiplied clock with the fractional frequency divider circuit for each channel.

12 Claims, 6 Drawing Sheets

U.S. PATENT DOCUMENTS

2005/0127959 A1* 6/2005 Leifso et al. ................ 327/117
2008/0072095 A1* 3/2008 Nambu et al. ............... 713/401

FOREIGN PATENT DOCUMENTS

| | | |
|---|---|---|
| JP | 51-69347 A | 6/1976 |
| JP | 62-265815 A | 11/1987 |
| JP | 2-125527 A | 5/1990 |
| JP | 4-104614 A | 4/1992 |
| JP | 5-28789 A | 2/1993 |
| JP | 7-195999 A | 8/1995 |
| JP | 10-327067 A | 12/1998 |
| JP | 2000-151539 A | 5/2000 |
| JP | 2001-127622 A | 5/2001 |
| JP | 2001-251181 A | 9/2001 |
| JP | 2003-333021 A | 11/2003 |

OTHER PUBLICATIONS

Hiroshi Doi, Ohmsha, Ltd., "Dijitaru IC no Jitsuyo Kairo Nyumon" [Introduction to Practical Digital IC Circuits], first printing of first edition published on Aug. 15, 2003; pp. 131-136.

* cited by examiner

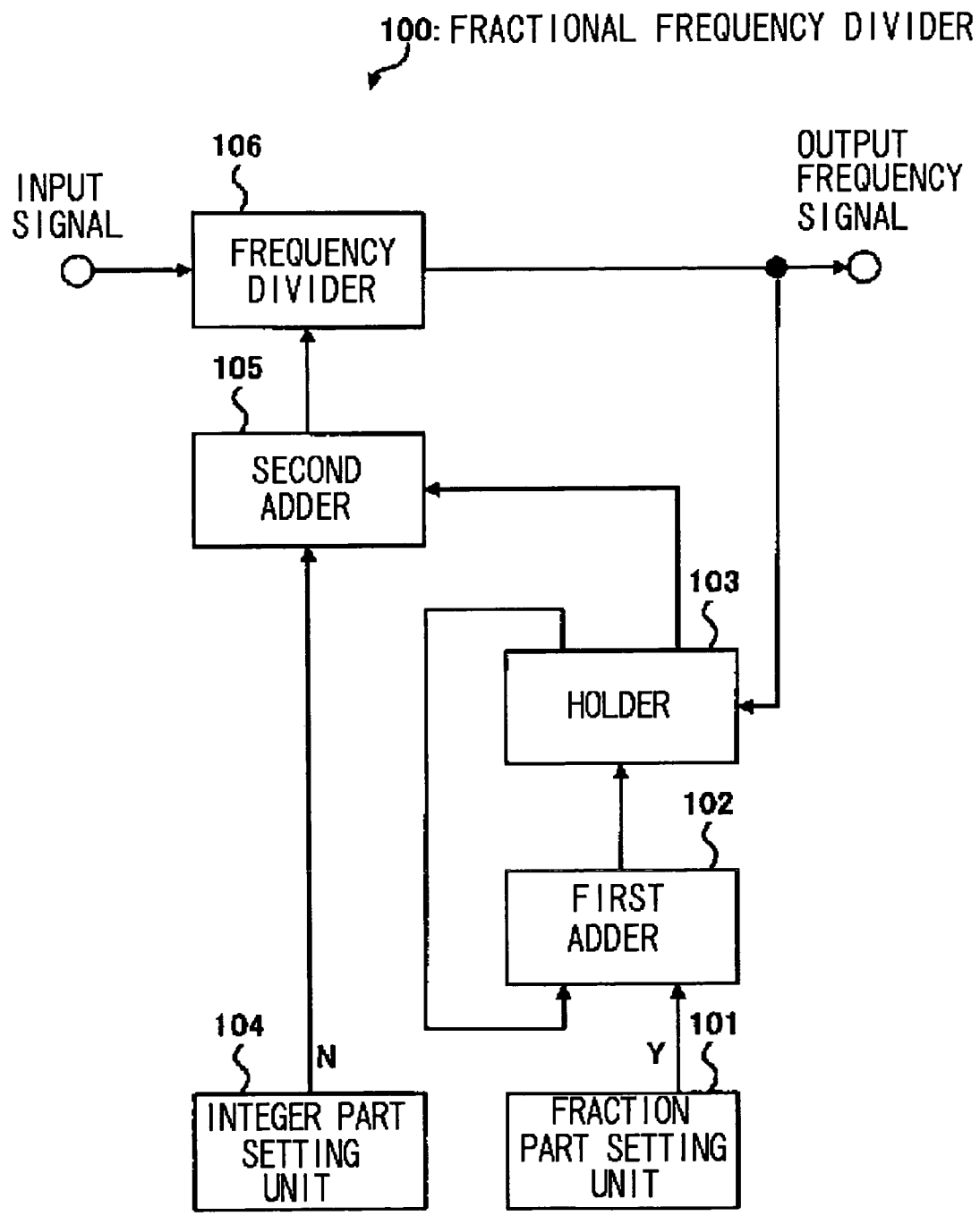

FIG. 6a *Related Art*

| RX | PLL | TX | RX | PLL | TX | RX | PLL | TX | RX | PLL | TX |
|----|-----|----|----|-----|----|----|-----|----|----|-----|----|

FIG. 6b *Related Art*

| RX | RX | RX | RX | PLL | PLL | TX | TX | TX | TX |
|----|----|----|----|-----|-----|----|----|----|----|

FRACTIONAL FREQUENCY DIVIDER CIRCUIT AND DATA TRANSMISSION APPARATUS USING THE SAME

FIELD OF THE INVENTION

The present invention relates to a fractional frequency divider circuit and a data transmission apparatus using the same, and especially to a fractional frequency divider circuit suitable for supplying multiple kinds of clock to a data transmission apparatus used for high-speed communication, and a data transmission apparatus using the same.

BACKGROUND OF THE INVENTION

A conventional high-speed interface circuit is formed of a receiver circuit (RX) that receives external data and performs serial-parallel conversion thereof, a transmitter circuit (TX) that performs parallel-serial conversion of internal data, and a PLL that multiplies an external reference clock and supplies it to the RX and TX. In an apparatus comprising multiple channels constituted such that an RX is coupled with a TX, one PLL generally supplies a clock commonly to the multiple channels. However, in this case, the data speed cannot be changed for each channel. It is thought to be possible to change the data speed by frequency-dividing the clock with a frequency divider circuit, however, it is difficult to realize this when the data speed ratio is not an integer.

A circuit shown in FIG. 5 is known as a fractional frequency divider circuit where the N of its frequency division ratio (1/N) is not an integer. (Refer to Patent Document 1.) The fractional frequency divider circuit shown in FIG. 5 uses adders et al., therefore the circuit scale becomes large. Furthermore, it is constituted such that it obtains a desired fraction frequency-divided output by varying the frequency division ratio over time and obtaining the average, therefore, it cannot be used at all as a clock to be supplied to an RX and a TX that require a waveform with a duty ratio of 50%. For this reason, conventionally a PLL is provided for each channel as shown in FIG. 6a, or two PLLs are shared by multiple channels as shown in FIG. 6b.

[Patent Document 1]
Japanese Patent Kokai Publication No. JP-P2001-251181A (FIG. 1)

SUMMARY OF THE DISCLOSURE

A conventional fractional frequency divider circuit has a large circuit scale and it does not operate with a fixed frequency division ratio over time. Also, a conventional data transmission apparatus that has multiple channels and is able to change data speed for each channel is constituted such that it has multiple PLLs, therefore the circuit scale becomes large, and this results in the disadvantage of increase in consumption power. Therefore, there is much to be desired in the art.

According to a first aspect of the present invention, there is provided a fractional frequency divider circuit comprising an integer frequency divider circuit and a logic circuit. The integer frequency divider circuit is constituted by multiple master-slave flip-flops and frequency-divides a clock signal with a frequency-division ratio of 1/N (N is an integer). The logic circuit receives multiple signals outputted from master stages and slave stages of the master-slave flip-flops, and outputs a signal with a duty ratio of 50% obtained by frequency-dividing the clock signal with a frequency-division ratio of 2/N.

Furthermore, signals outputted from master stages or slave stages of the master-slave flip-flops are inputted into the logic circuit, and it also comprises a data latch circuit that outputs synchronously with a clock signal whose phase is different from the above-mentioned clock signal.

According to a second aspect of the present invention, there is provided a data transmission apparatus. The data transmission apparatus comprises a receiver circuit that performs serial-parallel conversion on a received signal and outputs the result, and a transmitter circuit that performs parallel-serial conversion on a transmitted signal and outputs the result, and a PLL that multiplies a reference clock signal and outputs a multiplied clock signal. The apparatus further comprises a fractional frequency divider circuit that outputs a signal obtained by frequency-dividing the multiplied clock signal with a frequency-division ratio of 2/N(N is an integer). The fractional frequency divider circuit comprises: an integer frequency divider circuit, constituted by multiple master-slave flip flops, that frequency-divides the multiplied clock signal with a frequency-division ratio of 1/N, and a logic circuit, into which multiple signals outputted from master stages and slave stages of the master-slave flip-flops are inputted. The logic circuit outputs a signal obtained by frequency-dividing the multiplied clock signal with a frequency-division ratio of 2/N(N is an integer). The receiver circuit and transmitter circuit are constituted such that they operate selectively switching over between the multiplied clock signal and a clock signal outputted by the fractional frequency divider circuit.

Furthermore, it is constituted such that signals outputted from master stages or slave stages of the master-slave flip-flops are inputted into the logic circuit, and there is a data latch circuit that outputs synchronously with a clock signal whose phase is different from the multiplied clock signal. Further, the waveform of the output signal of the logic circuit has a duty ratio of 50%.

Furthermore, the integer frequency divider circuit constitutes a frequency divider circuit that frequency-divides the multiplied clock signal and outputs the result to a phase comparator of the PLL.

Furthermore, the data transmission apparatus comprises multiple channels, wherein a pair of the receiver circuit and transmitter circuit is one channel, and for each channel, it can select between the multiplied clock signal and the clock signal outputted by the fractional frequency divider circuit.

The meritorious effects of the present invention are summarized as follows.

Since a fractional frequency divider circuit is incorporated as a part of a usual frequency divider circuit and its output is used, the clock data recovery operation, multiplexer operation, and demultiplexer operation of a data transmission apparatus becomes possible with small size and low power consumption.

BRIEF DESCRIPTION OF THE DRAWINGS

FIG. 5 is a drawing showing the constitution of a conventional fractional frequency divider circuit.

FIGS. 6*a* and 6*b* are drawings showing a constitution of a data transmission apparatus according to the related art.

PREFERRED EMBODIMENTS OF THE INVENTION

Figure 1:
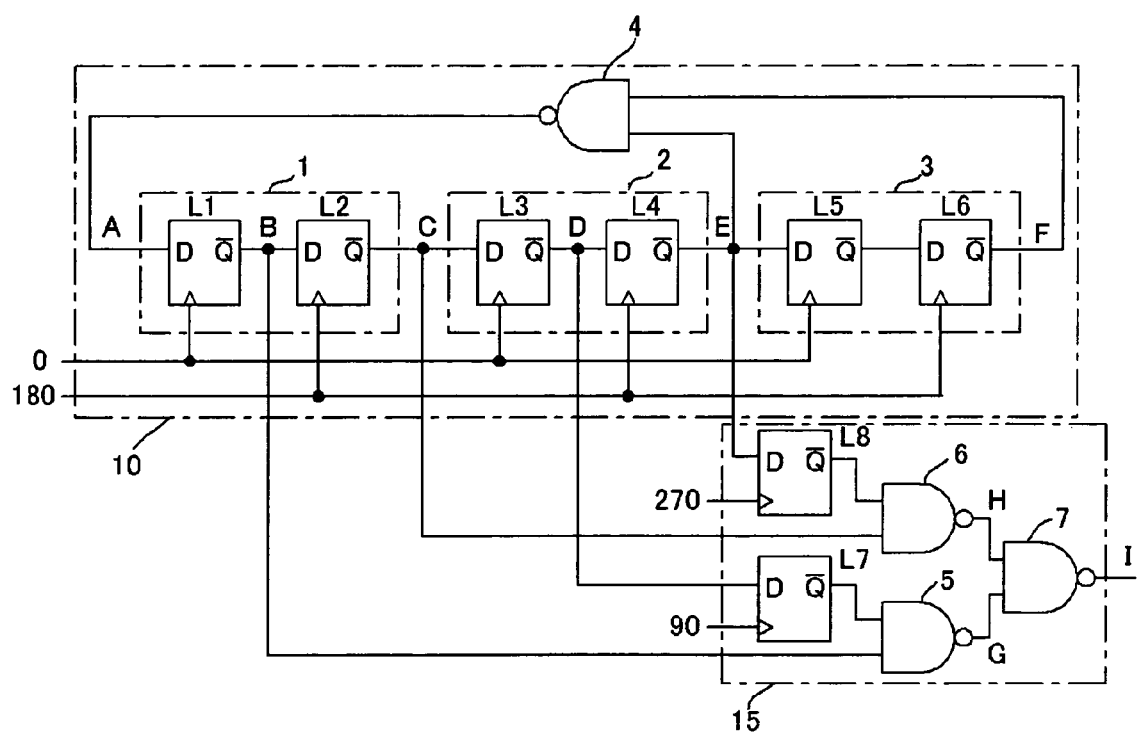
FIG. 1 is a drawing showing a constitution of a fractional frequency divider circuit of Embodiment 1 of the present invention.
Figure 2:
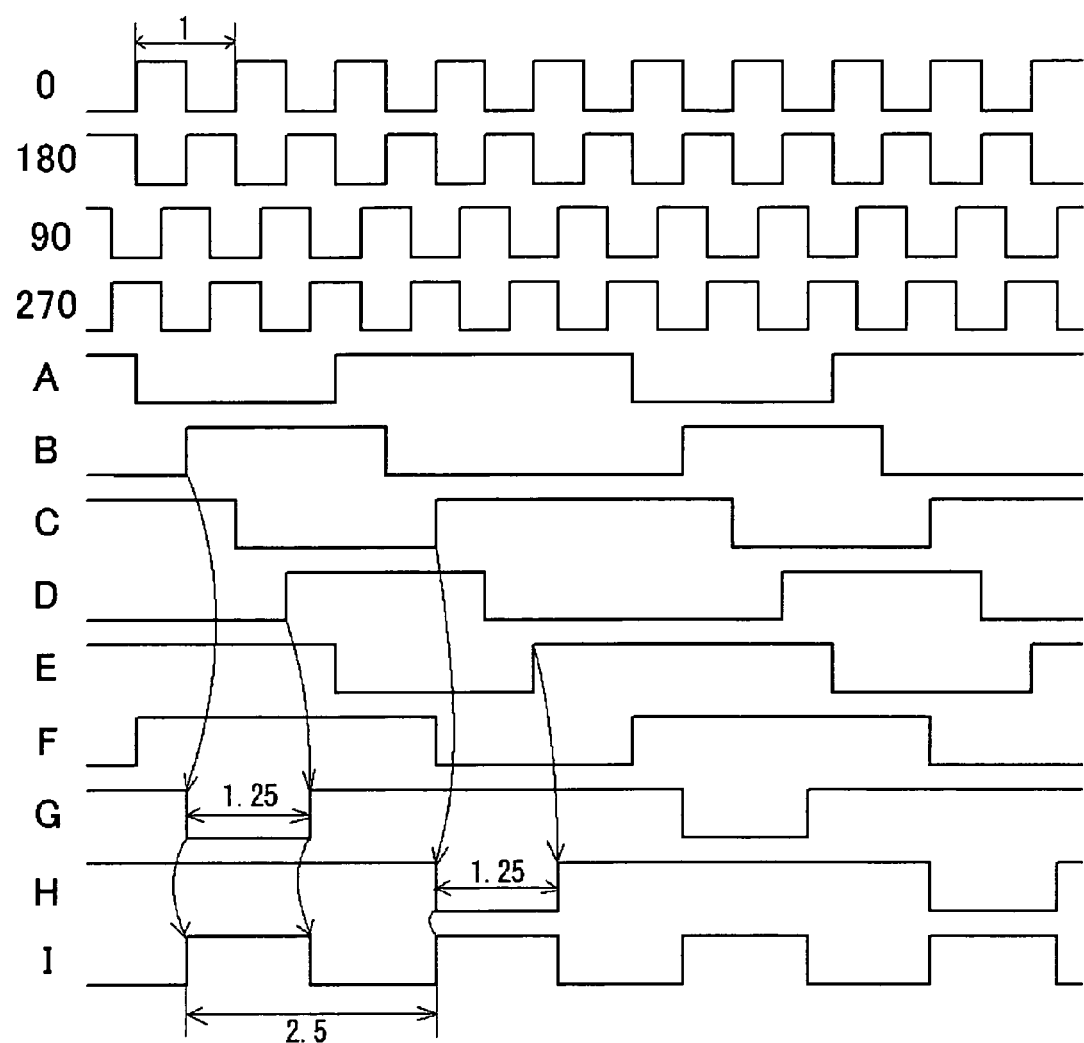
FIG. 2 is a timing chart explaining the operation of the fractional frequency divider circuit of Embodiment 1 of the present invention.

Hereinafter, embodiments of the present invention will be described with reference to drawings. FIG. 1 is a drawing showing a constitution of Embodiment 1 and FIG. 2 is a timing chart for explaining its operation. A fractional frequency divider circuit shown in FIG. 1 is able to output a 1/2.5 frequency-divided clock signal by taking out signals from an internal node B, internal node C, internal node D, and internal node E of a 1/5 frequency divider circuit 10, and processing them at a logic circuit 15.

The 1/5 frequency divider circuit 10 comprises master-slave flip-flops 1, 2, 3 and a NAND gate 4. L1 and L2, L3 and L4, and L5 and L6 are data latches that constitute master stages and slave stages respectively. The logic circuit 15 comprises data latches L7 and L8, and NAND gates 5, 6, and 7. At the data latches L1 through L7, D is a data input terminal and /Q is an inverted signal output terminal.

The 1/2.5 frequency divider circuit shown in FIG. 1 operates as a 4-phase clock of phases at 0, 90, 180 and 270 degrees. A 0-degree clock signal is inputted into the data latches L1, L3, and L5, and a 90-degree signal and 270-degree signal are inputted into the data latches L7 and L8, respectively.

Next, its operation is explained using FIG. 2. FIG. 2 is a timing chart showing the signal waveforms of each node of the frequency divider circuit shown in FIG. 1. At the nodes A through E and a node F of the 1/5 frequency divider circuit, signals with a cycle 5 times as long as the clock signal, albeit offset in phase and polarity, are obtained. The node B and the node D have the same waveform, which is a 1/5 frequency-divided waveform whose phase is offset from the clock signal by one cycle. By NANDing a signal obtained by latching the waveform of the node D with the data latch L7, into which a 90-degree clock signal with a phase offset of 90 degrees is inputted, with a signal of the node B, a 1/5 frequency-divided waveform whose low level duration is 1.25 cycle of the clock signal is obtained at a node G.

Similarly, by NANDing a signal obtained by latching a signal of the node E with the data latch L8, into which a 270-degree clock signal whose phase is offset from a 180-degree clock by 90 degrees is inputted, with the waveform of the node C, a 1/5 frequency-divided waveform whose low level duration is 1.25 cycle of the clock signal is obtained. The phases of the signals of the node G and a node H are shifted from each other by 2.5 cycle of the clock signal, and by NANDing these signals, a signal whose cycle is 2.5 cycle of the clock signal is obtained at a node I, which is an output of the NAND gate 7. In other words, a 1/2.5 frequency divider circuit that is able to obtain an output with a duty ratio of 50% can be realized according to the present invention.

Figure 3:
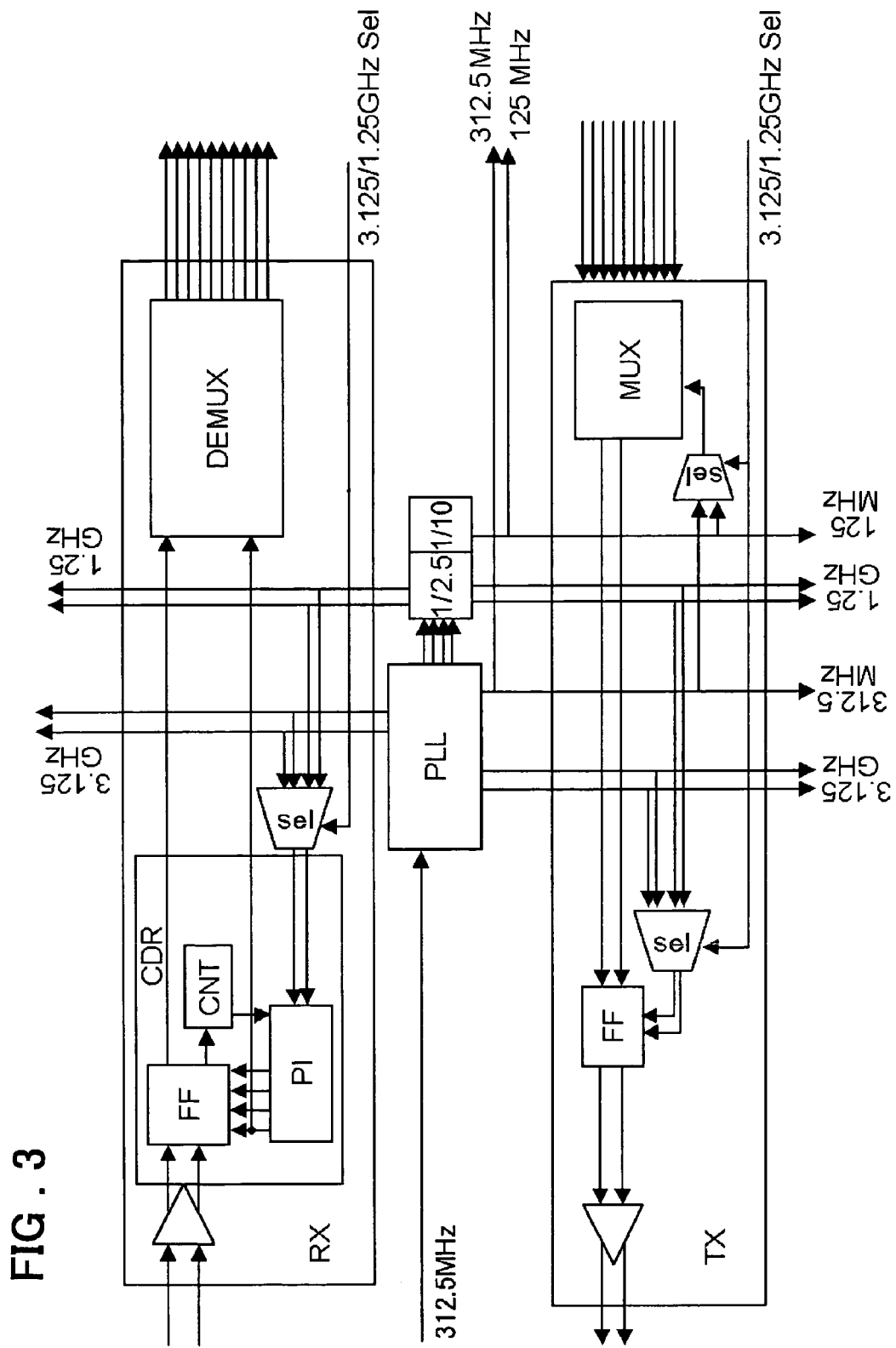
FIG. 3 is a drawing showing a constitution of a data transmission apparatus of Embodiment 2 of the present invention.

In Embodiment 2, the present invention is applied to a data transmission apparatus with multiple channels wherein it is possible to set data speed for each channel separately. FIG. 3 is a block diagram of the present embodiment. A transmitter circuit (TX) and receiver circuit (RX) for one channel are shown in FIG. 3. In the present embodiment, two data speeds can be supported by providing a 1/2.5 frequency divider circuit at a PLL part and arranging two kinds of clock, and by providing a selection circuit for each of the TX and RX, and switching over between frequency-multiplied clocks (3.125 GHz and 1.25 GHz in FIG. 3).

The receiver circuit (RX) is comprised of a clock data recovery circuit (CDR) and a serial-parallel conversion circuit (DEMUX). The clock data recovery circuit (CDR) comprises a phase interpolator part (PI), a receiver flip-flop (FF), and a control circuit (CNT). At the phase interpolator part (PI), an inputted differential clock signal is frequency-divided by 2, a 4-phase clock signal whose cycle (period) is 1/2 of the inputted signal is generated, and the received data is latched at the FF. In FIG. 3, the FF is represented by one block diagram. From the 4-phase clock and latched output of the FF, the control circuit (CNT) extracts the phase relationship between the clock and data, and phase controls the clock output at the phase interpolator part (PI). This kind of a clock data recovery circuit is proposed by the present inventor in Japanese Patent Kokai Publication No. JP-P2003-333021A et al, the entire disclosure thereof being incorporated by reference thereto. Furthermore, the data from the FF is forwarded to the serial-parallel conversion circuit (DEMUX). At the serial-parallel conversion circuit (DEMUX), serial-parallel conversion is performed using the clock regenerated at the clock data recovery circuit (CDR).

The transmitter circuit (TX) synchronizes the output of a parallel-serial conversion circuit (MUX) with a selected clock signal (3.125 GHz and 1.25 GHz in FIG. 3) at a flip-flop FF and outputs a resultant signal as a transmission signal.

Figure 4:
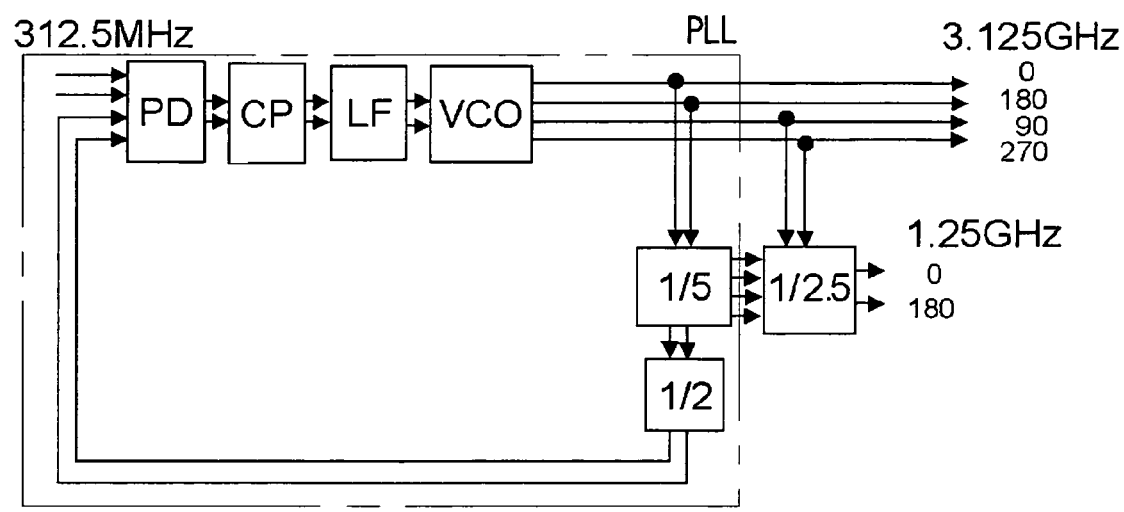
FIG. 4 is a drawing showing a constitution of a PLL and 1/2.5 frequency divider circuit of the data transmission apparatus of Embodiment 2 of the present invention.

FIG. 4 is a block diagram showing an important part of the constitution of the PLL and 1/2.5 frequency divider circuit shown in FIG. 3. The PLL comprises a phase comparator (PD), charge pump circuit (CP), low pass filter (LF), voltage-controlled oscillator (VCO), 1/5 frequency divider circuit (1/5), and 1/2 frequency divider circuit. The PLL operates so that the phases of a reference signal (312.5 MHz) inputted into the PD differentially and a differential signal obtained by frequency-dividing the output of the VCO by 1/10 using the 1/5 frequency divider circuit and 1/2 frequency divider circuit match, and a 4-phase clock signal (3.125 GHz), a 10-fold multiplication of the reference signal, is outputted from the VCO.

The 1/2.5 frequency divider circuit is constituted by a 1/5 frequency divider circuit (1/5) and 1/2.5 circuit (1/2.5). The 1/5 frequency divider circuit (1/5) corresponds to the 1/5 frequency divider circuit 10 shown in FIG. 1 and 1/2.5 circuit to the logic circuit 15 shown in FIG. 1. In other words, in the present embodiment, an output that is a frequency-divided output of the PLL by 1/2.5 is originated from the internal signal of the 1/5 frequency divider circuit that constitutes (part of) the PLL, and a data transmission apparatus wherein it is possible to change data speed for each channel can be realized by adding a minimum amount of circuits.

The present invention is explained above using examples of embodiment. However, the present invention is not limited to the above embodiments, and it goes without saying that it includes various modifications and revisions, which may be made possible by a manufacturer, within the scope of the invention specified by each claim of the patent claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A fractional frequency divider circuit comprising:
an integer frequency divider circuit; and
a logic circuit,
wherein said integer frequency divider circuit comprises multiple master-slave flip-flops connected in series and each of the master flip-flops in the multiple master-slave flip-flops receives a first clock signal and each of the slave flip-flops in the multiple master slave flip-flops receives a clock signal which is 180 degrees out of phase with the first clock signal,
said integer frequency divider circuit frequency-divides the first clock signal with a frequency-division ratio of 1/N where N is an integer, and
said logic circuit receives a plurality of signals output from master stages and slave stages of said multiple master-slave flip-flops, and said logic circuit comprising a first data latch which receives a clock signal which is 90 degrees out of phase with the first clock signal and a second data latch which receives a clock signal which is 270 degrees out of phase with the first clock signal, and outputs a signal with a duty ratio of 50% obtained by frequency-dividing said first clock signal with a frequency-division ratio of 2/N.

2. The fractional frequency divider circuit as defined in claim 1 wherein said signals output from master stages or slave stages of said multiple master-slave flip-flops are supplied to said logic circuit, and
said fractional frequency divider circuit further comprises a data latch circuit that outputs an output signal synchronously with a clock signal whose waveform is the same as that of said first clock signal, but phase is different from that of said first clock signal.

3. A data transmission apparatus comprising:
a receiver circuit that performs serial-parallel conversion on a received signal and outputs the result;
a transmitter circuit that performs parallel-serial conversion on a transmitted signal and outputs the result;
a PLL that multiplies a reference clock signal and outputs a multiplied clock signal; and
a fractional frequency divider circuit that outputs a signal obtained by frequency-dividing said multiplied clock signal with a frequency-division ratio of 2/N where N is an integer,
wherein said fractional frequency divider circuit comprises an integer frequency divider circuit and a logic circuit,
said integer frequency divider circuit comprising multiple master-slave flip flops connected in series and each of the master flip-flops in the multiple master-slave flip-flops receives a first clock signal and each of the slave flip-flops in the multiple master slave flip-flops receives a clock signal which is 180 degrees out of phase with the first clock signal,
said integer frequency divider circuit frequency-dividing said multiplied clock signal with a frequency-division ratio of 1/N,
said logic circuit receiving a plurality of signals output from master stages and slave stages of said multiple master-slave flip-flops, and said logic circuit comprising a first data latch which receives a clock signal which is 90 degrees out of phase with the multiplied clock signal and a second data latch which receives a clock signal which is 270 degrees out of phase with the multiplied clock signal, and outputting a signal obtained by frequency-dividing said multiplied clock signal with a frequency-division ratio of 2/N where N is an integer, and
said receiver circuit and transmitter circuit being constituted such that they operate selectively switching over between said multiplied clock signal and a clock signal output by said fractional frequency divider circuit.

4. The data transmission apparatus as defined in claim 3 wherein signals output from master stages or slave stages of said multiple master-slave flip-flops are supplied to said logic circuit,
said fractional frequency divider circuit further comprising a data latch circuit that outputs an output signal synchronously with a clock signal whose phase is different from said multiplied clock signal.

5. The data transmission apparatus as defined in claim 3 wherein the waveform of an output signal of said logic circuit has a duty ratio of 50%.

6. The data transmission apparatus as defined in claim 4 wherein the waveform of an output signal of said logic circuit has a duty ratio of 50%.

7. The data transmission apparatus as defined in claim 3 wherein said integer frequency divider circuit constitutes a frequency divider circuit that frequency-divides said multiplied clock signal and outputs the result to a phase comparator of said PLL.

8. The data transmission apparatus as defined in claim 4 wherein said integer frequency divider circuit constitutes a frequency divider circuit that frequency-divides said multiplied clock signal and outputs the result to a phase comparator of said PLL.

9. The data transmission apparatus as defined in claim 3 comprising multiple channels, wherein a pair of said receiver circuit and transmitter circuit forms one channel, and for each channel, selection is performed between said multiplied clock signal and a clock signal output by said fractional frequency divider circuit.

10. The data transmission apparatus as defined in claim 4 comprising multiple channels, wherein a pair of said receiver circuit and transmitter circuit forms one channel, and for each channel, selection is performed between said multiplied clock signal and a clock signal output by said fractional frequency divider circuit.

11. The data transmission apparatus as defined in claim 5 comprising multiple channels, wherein a pair of said receiver circuit and transmitter circuit forms one channel, and for each channel, selection is performed between said multiplied clock signal and a clock signal output by said fractional frequency divider circuit.

12. The data transmission apparatus as defined in claim 7 comprising multiple channels, wherein a pair of said receiver circuit and transmitter circuit forms one channel, and for each channel, selection is performed between said multiplied clock signal and a clock signal output by said fractional frequency divider circuit.

* * * * *